United States Patent
Nakatsu et al.

(10) Patent No.: US 6,984,850 B2
(45) Date of Patent: *Jan. 10, 2006

(54) SEMICONDUCTOR LIGHT-EMITTING DIODE

(75) Inventors: Hiroshi Nakatsu, Tenri (JP); Osamu Yamamoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/702,642

(22) Filed: Nov. 7, 2003

(65) Prior Publication Data

US 2004/0104396 A1   Jun. 3, 2004

Related U.S. Application Data

(63) Continuation of application No. 09/373,544, filed on Aug. 13, 1999.

(30) Foreign Application Priority Data

Aug. 21, 1998   (JP)   ............................... 10-236156

(51) Int. Cl.
*H01L 33/00* (2006.01)
*H01L 21/00* (2006.01)

(52) U.S. Cl. ............................ 257/94; 257/96; 257/97; 257/103; 438/22; 438/46; 438/47

(58) Field of Classification Search ...................... None
See application file for complete search history.

(56) References Cited

U.S. PATENT DOCUMENTS 5,008,718 A * 4/1991 Fletcher et al. ............... 357/17
5,153,889 A   10/1992 Sugawara et al.
5,656,829 A   8/1997 Sakaguchi et al.
5,739,553 A   4/1998 Noto et al.
5,814,839 A * 9/1998 Hosoba ....................... 257/96

FOREIGN PATENT DOCUMENTS

| DE | 198 08 446 A1 | 9/1998 |
|---|---|---|
| DE | 197 55 009 C1 | 8/1999 |
| EP | 0 378 919 A2 | 7/1990 |
| EP | 0 434 233 A1 | 6/1991 |
| GB | 2 306 047 A | 4/1997 |
| JP | 3-171679 A | 7/1991 |
| JP | 7-15038 A | 1/1995 |
| JP | 11-17218 A | 1/1998 |
| JP | 10-242510 A | 9/1998 |
| JP | 10-256667 A | 9/1998 |

OTHER PUBLICATIONS

Japanese Office Action mailed Jun. 26, 2003 and translation thereof in corresponding Japanese application No. 10-236156.

* cited by examiner

Primary Examiner—Donghee Kang
(74) Attorney, Agent, or Firm—Nixon & Vanderhye, P.C.

(57) ABSTRACT

A light-emitting diode includes: a semiconductor substrate; and a layered structure, made of an AlGaInP type compound semiconductor material and provided on the semiconductor substrate. The layered structure includes: a light-emitting structure composed of a pair of cladding layers and an active layer for emitting light provided between the pair of cladding layers; and a current diffusion layer which is lattice-mismatched with the light-emitting structure. A lattice mismatch $\Delta a/a$ of the current diffusion layer with respect to the light-emitting structure defined by the following expression is $-1\%$ or smaller:

$$\Delta a/a = (a_d - a_e)/a_e$$

where $a_d$ is a lattice constant of the current diffusion layer, and $a_e$ is a lattice constant of the light-emitting structure.

4 Claims, 13 Drawing Sheets

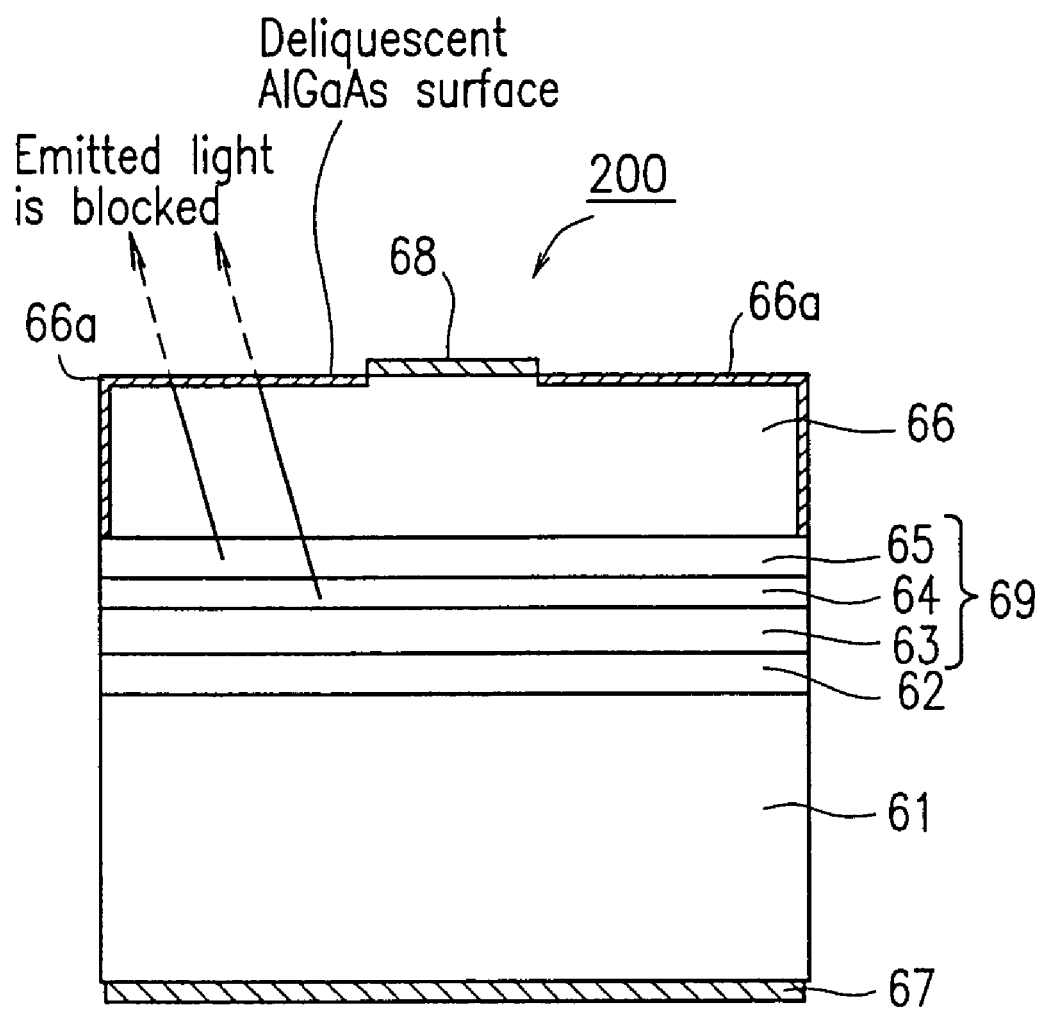

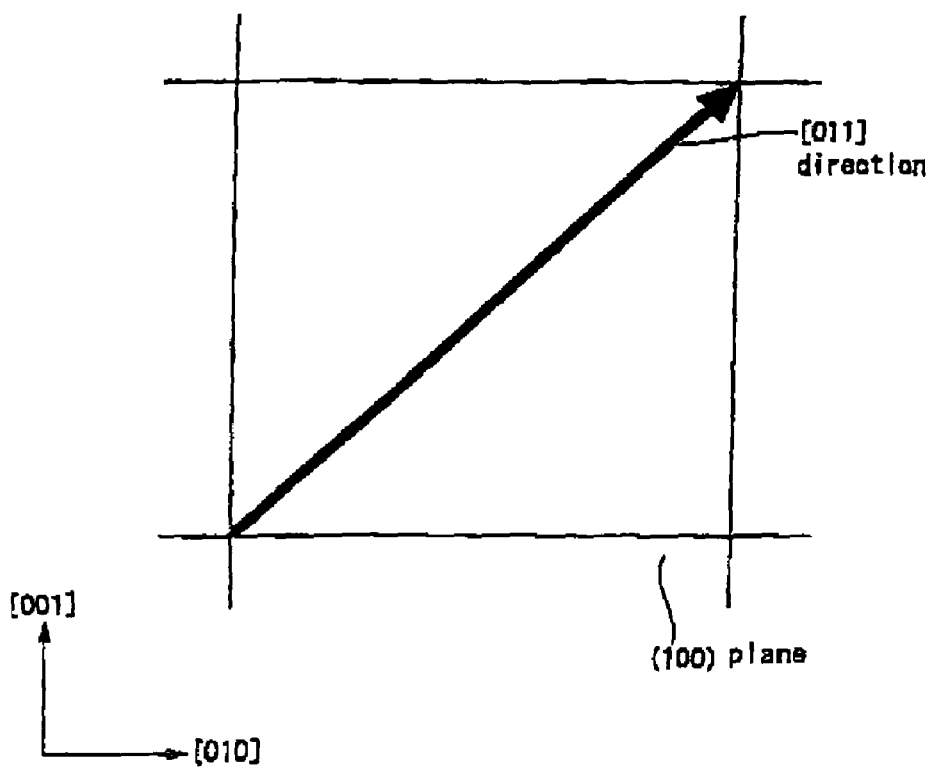

SEMICONDUCTOR LIGHT-EMITTING DIODE

This is a continuation of application Ser. No. 09/373,544, filed Aug. 13, 1999.

BACKGROUND OF THE INVENTION

1. Field of the Invention

The present invention relates to a semiconductor light-emitting diode, and more specifically, to a semiconductor light-emitting diode having a current diffusion layer.

2. Description of the Related Art

An AlGaInP type material has drawn attention as a material to-be used for a light-emitting element which emits light having a wavelength in a range of 550 to 650 nm, since the AlGaInP type material has the largest bandgap of a direct transition type among III–V group compound semiconductor materials excluding a nitride. In particular, a pn-junction type light-emitting diode, in which a light-emitting structure (a layered structure including an active layer) made of an AlGaInP type material lattice-matching with GaAs is grown on a GaAs substrate, is capable of emitting light with higher luminance in a wavelength region corresponding to red to green light, as compared with a light-emitting diode provided with a light-emitting structure made of a material such as GaP or AlGaAs.

In order to form a light-emitting diode with high luminance, it is important to enhance a light-emission efficiency as well as a current injection efficiency into a light-emitting structure, and to allow light to efficiently emit from a device.

A conventional light-emitting diode having a light-emitting structure made of an AlGaInP type material will be described with reference to the drawings. FIG. 8 is a cross-sectional view of such a light-emitting diode 200.

As shown in FIG. 8, a light-emitting diode 200 has a structure in which on an n-type GaAs substrate 61, an n-type GaAs buffer layer 62, a light-emitting structure 69 made of an AlGaInP type material, and a p-type $Al_xGa_{1-x}As$ current diffusion layer 66 are successively layered. The light-emitting structure 69 includes an n-type AlGaInP cladding layer 63, a p-type AlGaInP cladding layer 65, and an AlGaInP active layer 64 interposed between the cladding layers 63 and 65. A p-type electrode 68 is provided on the top surface of the $Al_xGa_{1-x}As$ current diffusion layer 66, and an n-type electrode 67 is provided on the bottom surface of the substrate 61.

A p-type $Al_xGa_{1-x}As$ layer is often used as the current diffusion layer 66 in such a light-emitting diode 200 as described above for the following reason.

The p-type $Al_xGa_{1-x}As$ layer is transparent to light having a wavelength of 550 to 650 nm which can be emitted by the light-emitting structure 69 made of a $(Al_xGa_{1-x})_yIn_{1-y}P$ type semiconductor material, and therefore advantageous for obtaining a higher light-emission efficiency. Furthermore, the p-type $Al_xGa_{1-x}As$ layer has a low resistivity, which makes it easy to obtain an ohmic contact with the p-type electrode 68 when employed as the current diffusion layer 66. In addition, it is easy to grow a p-type $Al_xGa_{1-x}As$ layer including crystal of a higher quality, as compared with an $(Al_xGa_{1-x})_yIn_{1-y}P$ type semiconductor material. Thus, the p-type $Al_xGa_{1-x}As$ layer can be relatively easily grown after the growth of a double hetero layer (the "DH layer") made of an $(Al_xGa_{1-x})_yIn_{1-y}P$ type, i.e., the light-emitting structure 69.

Regarding the material to be used for the current diffusion layer 66, comparisons between a conventional $Al_xGa_{1-x}As$ type material and an $(Al_xGa_{1-x})_yIn_{1-y}P$ type material will be explained below. Throughout the present specification, the term "Al mole fraction" refers to a mole fraction x of Al with respect to Ga (i.e., x= Al/(Al+Ga)). The term "In mole fraction" refers to a mole fraction 1−y of In with respect to Al and Ga (i.e., 1−y= In/(Al+Ga+In)). Moreover, the compositions of "$(Al_xGa_{1-x})_yIn_{1-y}P$" and "$Al_xGa_{1-x}As$" may be simply referred to as "AlGaInP" and "AlGaAs", respectively.

FIG. 9 is a graph showing the relationship between the resistivity of an $Al_xGa_{1-x}As$ current diffusion layer lattice-matching with a GaAs substrate and the Al mole fraction x thereof, and between the resistivity of an $(Al_xGa_{1-x})_{0.51}In_{0.49}P$ current diffusion layer (i.e., 1−y= 0.49) lattice-matching with the GaAs substrate and the Al mole fraction x thereof.

It is understood from FIG. 9 that the $Al_xGa_{1-x}As$ current diffusion layer exhibits a resistivity of about 0.06 Ω cm, for example, at an Al mole fraction x of 0.8. Thus, a low resistivity can be obtained even at a high Al mole fraction x.

In contrast, the $(Al_xGa_{1-x})_{0.05}In_{0.49}P$ current diffusion layer exhibits a resistivity of about 0.15 to about 3 Ω cm at an Al mole fraction x in the range of 0 to 0.8. These values of resistivity are larger by one order of magnitude than those obtainable with the $Al_xGa_{1-x}As$ layer. Even if the Al mole fraction is decreased, the resistivity is still higher by 50 times than that of the $Al_xGa_{1-x}As$ layer. Accordingly, the $(Al_xGa_{1-x})_{0.51}In_{0.49}P$ current diffusion layer is inferior to the $Al_xGa_{1-x}As$ current diffusion layer, since a low resistivity cannot be obtained.

Furthermore, in order for the $(Al_xGa_{1-x})_{0.51}In_{0.49}P$ current diffusion layer to allow light having a wavelength of 550 to 650 nm emitted from the light-emitting structure 69 to transmit therethrough, it is required to prescribe the Al mole fraction x to be 0.50 or more. In this case, the resistivity of the $(Al_xGa_{1-x})_{0.51}In_{0.49}P$ current diffusion layer becomes higher by two orders of magnitude, as compared with that of the $Al_xGa_{1-x}As$ current diffusion layer.

If the resistivity is high, the current diffusion ability of the current diffusion layer is decreased, and a current does not spread over the entire chip. As a result, light-emission from a portion of the light-emitting structure right below the electrode becomes dominant. The light emitted from such a portion is likely to be blocked by the electrode, whereby the emitted light is unlikely to be output. Accordingly, the increase in resistivity of the current diffusion layer causes a light-emission efficiency to decrease. Furthermore, the increase in resistivity of the current diffusion layer causes an operating voltage to increase.

Thus, the $(Al_xGa_{1-x})_{0.51}In_{0.49}P$ current diffusion layer which is lattice-matched with GaAs has a higher resistivity than that of the $Al_xGa_{1-x}As$ current diffusion layer, and consequently has adverse effects on the operational characteristics of a resultant light-emitting diode. Therefore, the $Al_xGa_{1-x}As$ layer is typically employed as the current diffusion layer in the conventional art, instead of the AlGaInP type layer.

As described above, the $Al_xGa_{1-x}As$ layer suffices as the current diffusion layer of a light-emitting diode, as far as the resistivity is concerned. In order for the $Al_xGa_{1-x}As$ current diffusion layer to be transparent with respect to light having a wavelength of 550 to 650 nm, it is required to prescribe an Al mole fraction x thereof to be 0.65 or more. However, when the Al mole fraction x becomes high, the $Al_xGa_{1-x}As$ layer will exhibit a deliquescence. Thus, in the case where a light-emitting diode having an $Al_xGa_{1-x}As$ layer with a high Al mole fraction x is operated under the conditions of high temperature and high humidity, light intensity is likely to be remarkably decreased.

FIG. 10 shows changes in a chip light intensity (i.e., an intensity of light obtained from the semiconductor light-emitting diode chip) with a passage of time, in the case where a light-emitting diode chip having the $Al_xGa_{1-x}As$ current diffusion layer is operated under the conditions of a temperature of 60° C. and a humidity of 95%. In FIG. 10, data for the chip light intensities are indicated as relative values.

As seen from FIG. 10, as an operating time becomes longer, a chip light intensity is decreased. Furthermore, as an Al mole fraction becomes larger, a chip light intensity is more remarkably decreased.

Such a deterioration of a light-emitting diode will be described with reference to FIG. 11. FIG. 11 shows the light-emitting diode 200 previously described with reference to FIG. 8, but in a deteriorated condition. Since like components are designated with like reference numerals, the explanations thereof are omitted here.

As shown in FIG. 11, while operating the light-emitting diode 200 under the conditions of high temperature and high humidity, the surface of the AlGaAs current diffusion layer 66 with a high Al mole fraction tends to absorb moisture so as to be deliquescent, thereby resulting in black-colored portions 66a on the surface thereof. Such black-colored portions 66a on the surface of the current diffusion layer 66 absorb the light (represented by arrows in FIG. 11) emitted from the inside of the light-emitting diode 200. Thus, in the case where the AlGaAs layer with a high Al mole fraction is employed as the current diffusion layer, it is difficult to provide a light-emitting diode exhibiting stable luminance over a long period of time.

As described above, although the AlGaAs layer has been typically used as the current diffusion layer in the conventional semiconductor light-emitting diode for the reason that a low resistivity can be obtained, the AlGaAs layer is not reliable under the conditions of high temperature and high humidity. On the other hand, when the $(Al_xGa_{1-x})_{0.51}In_{0.49}P$ layer capable of lattice-matching with the GaAs substrate typically used is employed as the current diffusion layer in place of the AlGaAs layer, the resultant current diffusion layer will then have a higher resistivity, so that sufficient luminance cannot be obtained.

SUMMARY OF THE INVENTION

A light-emitting diode of the present invention includes: a semiconductor substrate; and a layered structure, made of an AlGaInP type compound semiconductor material and provided on the semiconductor substrate. The layered structure includes: a light-emitting structure composed of a pair of cladding layers and an active layer for emitting light provided between the pair of cladding layers; and a current diffusion layer which is lattice-mismatched with the light-emitting structure, wherein a lattice mismatch Δ a/a of the current diffusion layer with respect to the light-emitting structure defined by the following expression is −1% or smaller:

$\Delta a/a = (a_d - a_e)/a_e$ where $a_d$ is a lattice constant of the current diffusion layer, and $a_e$ is a lattice constant of the light-emitting structure.

Crystal of the semiconductor substrate may be inclined by 8° (8 degrees) to 20° (20 degrees) in a [011] direction with respect to a (100) plane thereof.

Preferably, a composition of the current diffusion layer is selected in such a manner that the current diffusion layer becomes transparent with respect to a wavelength of light emitted from the light-emitting structure.

In one embodiment, a composition of the current diffusion layer is expressed as $(Al_xGa_{1-x})_yIn_{1-y}P$, and x is set in the range of 0.01 to 0.05 and 1×y is set in the range of 0.01 to 0.30 in the composition.

In one embodiment, a composition of the current diffusion layer is expressed as $(Al_xGa_{1-x})_yIn_{1-y}P$ and at least one of a value of x and a value of 1−y in the composition varies along a thickness direction of the layered structure.

Both the values of x and 1−y in the composition of the current diffusion layer may vary, independent of each other.

In one embodiment, a composition of the current diffusion layer is expressed as $(Al_xGa_{1-x})_yIn_{1-y}P$ and at least one of a value of x and a value of 1−y in the composition decreases in a step-like manner along a thickness direction of the layered structure from an interface with the light-emitting structure toward an opposite end of the current diffusion layer.

Both the values of x and 1−y in the composition of the current diffusion layer may decrease, independent of each other.

In one embodiment, a composition of the current diffusion layer is expressed as $(Al_xGa_{1-x})_yIn_{1-y}P$ and at least one of a value of x and a value of 1−y in the composition varies in a step-like manner along a thickness direction of the layered structure from an interface with the light-emitting structure toward an opposite end of the current diffusion layer, thereby controlling a resistivity of the current diffusion layer in the thickness direction.

Both the values of x and 1−y in the composition of the current diffusion layer may vary, independent of each other.

Thus, the invention described herein makes possible the advantage of providing a semiconductor light-emitting diode which has a high luminance and a low resistivity with being transparent to light having a wavelength of 550 to 650 nm emitted from a light-emitting structure in the light-emitting diode, and which does not cause deterioration of light-emitting characteristics even under the conditions of high temperature and high humidity.

This and other advantages of the present invention will become apparent to those skilled in the art upon reading and understanding the following detailed description with reference to the accompanying figures.

BRIEF DESCRIPTION OF THE DRAWINGS

FIG. 7A(b) shows a graph illustrating values of the In mole fraction 1−y at various thickness positions of the graded $(Al_xGa_{1-x})_yIn_{1-y}P$ current diffusion layer in Embodiment 2.

FIG. 11 shows a schematic cross-sectional view of the conventional light-emitting diode of FIG. 8 but in a deteriorated condition.

FIG. 12B is a top view of the crystal substrate showing [011] direction and the (100) plane.

DESCRIPTION OF THE PREFERRED EMBODIMENTS

The $(Al_xGa_{1-x})_yIn_{1-y}P$ layer (x=0.50, 1−y=0.49), which lattice-matches with the substrate and is transparent with respect to a light-emission wavelength, has a higher resistivity than that of the $Al_xGa_{1-x}As$ layer. One reason for this is that a P (phosphorus) group material contained in the AlGaInP layer has a lower mobility than that of an As (arsenic) group material contained in the AlGaAs layer, and hence, an effective mass of the AlGaInP layer is large. However, this does not have a significant effect. The more important reason is that the Al mole fraction x and the In mole fraction 1−y in the $(Al_xGa_{1-x})_yIn_{1-y}P$ layer lattice-matching with the substrate are high (i.e., x=0.50, 1−y=0.49).

More specifically, if the mole fractions of Al and In of the $(Al_xGa_{1-x})_yIn_{1-y}P$ layer become high, the AlGaInP layer becomes more likely to take in oxygen since Al and In are more likely to be oxidized than Ga. Furthermore, it is difficult to obtain an enhanced purity for Al and In, as compared with Ga. Therefore, when the Al and In mole fractions become high, the $(Al_xGa_{1-x})_yIn_{1-y}P$ layer will contain a larger amount of impurities such as oxygen and silicon. As a result, the resistivity of the AlGaInP layer is likely to increase.

Thus, in order to decrease the resistivity of the AlGaInP layer, the Al and In mole fractions therein should be decreased.

However, when the In mole fraction of the AlGaInP layer (to be employed as the current diffusion layer) is decreased, the lattice constant thereof is varied, whereby the AlGaInP current diffusion layer becomes lattice-mismatched with the underlying light-emitting structure. Hereinafter, the relationship between the In mole fraction and the lattice mismatch will be described.

Herein, a lattice mismatch (a lattice mismatch ratio) $\Delta a/a$ of the current diffusion layer with respect to the light-emitting structure is defined by the following expression:

$$\Delta a/a = (a_d - a_e)/a_e$$

where $a_d$ denotes a lattice constant of the current diffusion layer, and $a_e$ denotes a lattice constant of the light-emitting structure.

As an example, the case where a GaAs substrate is employed is described below.

The lattice constant of GaAs is about 5.65 Å. Since a pair of cladding layers and an active layer provided therebetween in the light-emitting structure are successively formed on the GaAs substrate, these layers lattice-match with the GaAs substrate as well as with each other. Thus, the lattice constant of the light-emitting structure is equal to that of the GaAs substrate.

Figure 1:
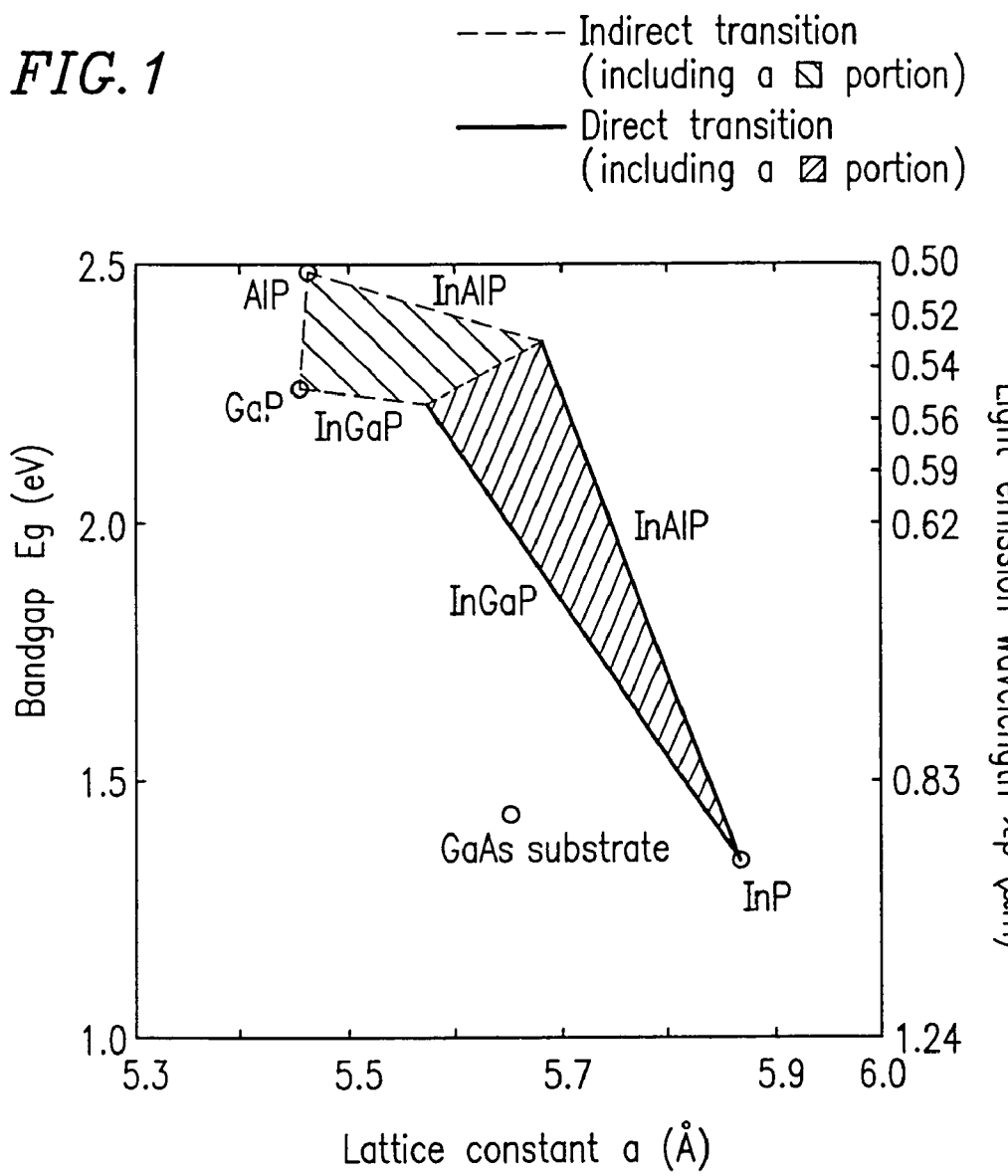
FIG. 1 shows a diagram illustrating the relationship between the lattice constant a and the bandgap Eg for various AlGaInP type materials.

FIG. 1 shows the relationship between the bandgap Eg and the lattice constant a for various AlGaInP type materials.

As shown in FIG. 1, when the In mole fraction is decreased in the AlGaInP type materials (so as to approach to a line connecting AlP and GaP in FIG. 1), the lattice constant of the AlGaInP type materials gradually becomes smaller than the lattice constant of a GaAs substrate (i.e., that of the light-emitting structure).

The lattice constant of the $(Al_xGa_{1-x})_yIn_{1-y}P$ current diffusion layer is determined by the In mole fraction 1−y thereof. The lattice mismatch between the $(Al_xGa_{1-x})_yIn_{1-y}P$ current diffusion layer and the GaAs substrate becomes maximum in the case where the current diffusion layer contains substantially no In, which exhibits the lattice mismatch of about −4%. It is found that such a level of the lattice mismatching will not have a significant effect on a resistivity of a bulk material.

Although the above descriptions are related to the case where the GaAs substrate is employed, the similar effects can be obtained with any other appropriate substrates, such as a GaP substrate, an InP substrate and the like. In the case where there is no limit to a material for the substrate, the lattice mismatch between the $(Al_xGa_{1-x})_yIn_{1-y}P$ current diffusion layer and the substrate may become about 8% at most with the variation of the In mole fraction. However, such a lattice mismatch will not have a significant effect on a resistivity of a bulk material.

As described above, although the lattice mismatching is generated between the $(Al_xGa_{1-x})_yIn_{1-y}P$ current diffusion layer and the underlying light-emitting structure by decreasing the In mole fraction of the constituting material for the current diffusion layer, this will not have significant disadvantages on the characteristics of a resultant light-emitting diode. Thus, by decreasing the In mole fraction of the $(Al_xGa_{1-x})_yIn_{1-y}P$ current diffusion layer to increase an absolute value of a lattice mismatch in the negative phase, the resistivity of the $(Al_xGa_{1-x})_yIn_{1-y}P$ current diffusion layer can be reduced. Accordingly, by decreasing the In mole fraction 1−y as well as the Al mole fraction x of the $(Al_xGa_{1-x})_yIn_{1-y}P$ current diffusion layer so that the current diffusion layer becomes intentionally lattice-mismatch with the light-emitting structure, the resistivity of the $(Al_xGa_{1-x})_yIn_{1-y}P$ current diffusion layer can be prescribed at the same level as that of the conventional AlGaAs current diffusion layer. Thus, it becomes possible to form the satisfactory current diffusion layer even by using the $(Al_xGa_{1-x})_yIn_{1-y}P$ layer.

Figure 2:
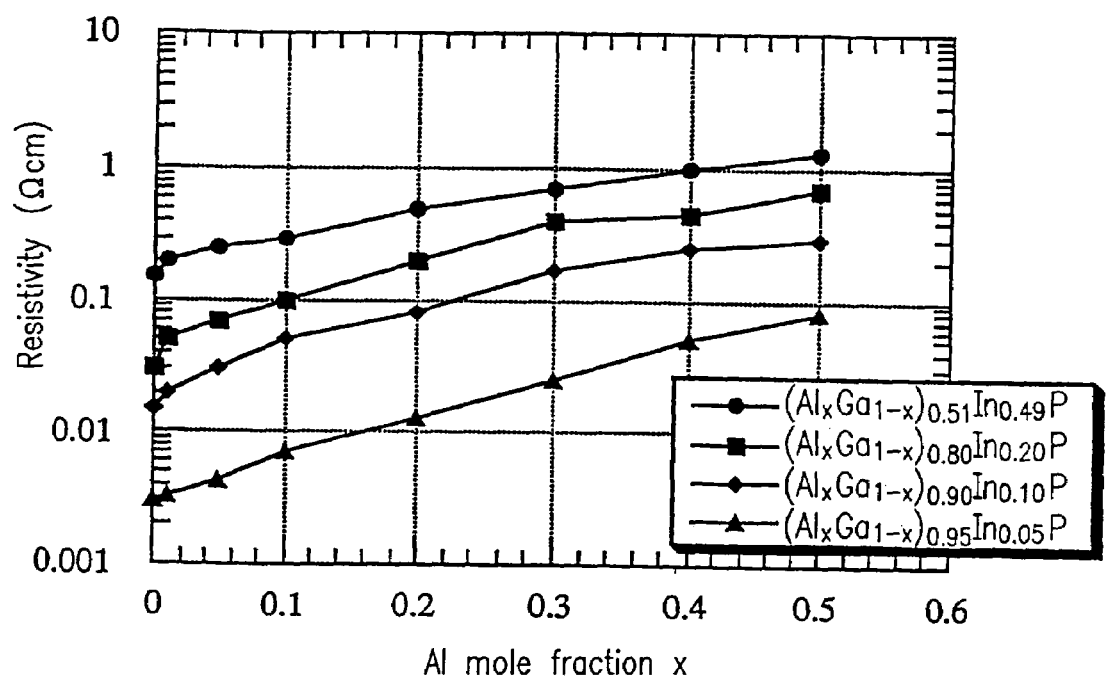
FIG. 2 shows graphs illustrating the relationship between the resistivity and the Al mole fraction x of AlGaInP type materials.

FIG. 2 shows data of a resistivity in the case where the Al and In mole fractions in various $(Al_xGa_{1-x})_yIn_{1-y}P$ type materials are decreased.

As is understood from FIG. 2, the resistivity of the $(Al_xGa_{1-x})_yIn_{1-y}P$ layer can be remarkably decreased by decreasing the Al and In mole fractions thereof. In particular, the $(Al_xGa_{1-x})_yIn_{1-y}P$ layer with the Al mole fraction x of 0.05 and the In mole fraction 1-y of 0.05 shows substantially the same resistivity as that of the AlGaAs current diffusion layer.

Figure 3:
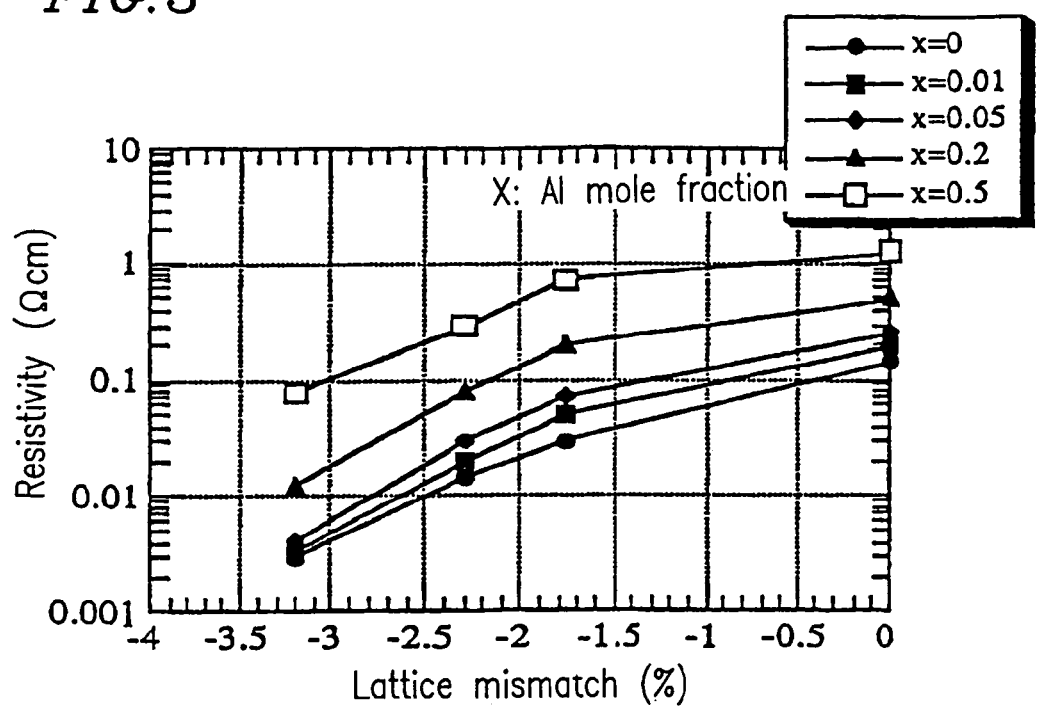
FIG. 3 shows graphs illustrating the relationship between the resistivity and the lattice mismatch of AlGaInP type materials.

The relationship shown in FIG. 2 will be further described in terms of the lattice mismatches of the current diffusion layer. In FIG. 3, the horizontal axis indicates the lattice mismatch Δ a/a of the $(Al_xGa_{1-x})_y In_{1-y}P$ current diffusion layer with respect to the substrate and the light-emitting structure, and the vertical axis indicates the resistivity of the $(Al_xGa_{1-x})_yIn_{1-y}P$ current diffusion layer.

It is understood from FIG. 3 that as the absolute value of the lattice mismatch becomes larger in the negative phase by decreasing the In mole fraction of the $(Al_xGa_{1-x})_yIn_{1-y}P$ current diffusion layer, the resistivity of the $(Al_xGa_{1-x})_yIn_{1-y}P$ current diffusion layer is also decreased. Since a practical level of resistivity of the current diffusion layer of a light-emitting diode is desirably about 0.1 Ω cm or less, it is understood from FIG. 3 that the lattice mismatch between the $(Al_xGa_{1-x})_yIn_{1-y}P$ current diffusion layer and the underlying light-emitting structure is preferably set to be about −1% or less. In order to realize the lattice mismatch in the above range, the In mole fraction 1-y of the $(Al_xGa_{1-x})_yIn_{1-y}P$ layer is required to be about 0.35 or less. Furthermore, it is preferable that the Al mole fraction x of the $(Al_xGal)_yIn_{1-y}P$ current diffusion layer is as low as possible. Accordingly, referring again to FIG. 3, it is more effective that the Al mole fraction x of the $(Al_xGa_{1-x})_yIn_{1-y}P$ current diffusion layer is prescribed to be about 0.05 or less.

In the light-emitting diode of the present invention, the lattice mismatch of the AlGaInP type current diffusion layer is about −1% or less. Therefore, the AlGaInP type current diffusion layer has substantially the same resistivity as that of the conventional AlGaAs type current diffusion layer. Thus, an operating voltage and power consumption of the resultant light-emitting diode are not increased, and a high light output efficiency from the light-emitting structure is obtained. Furthermore, the light-emitting diode of the present invention has high luminance and is highly reliable.

Figure 12A:
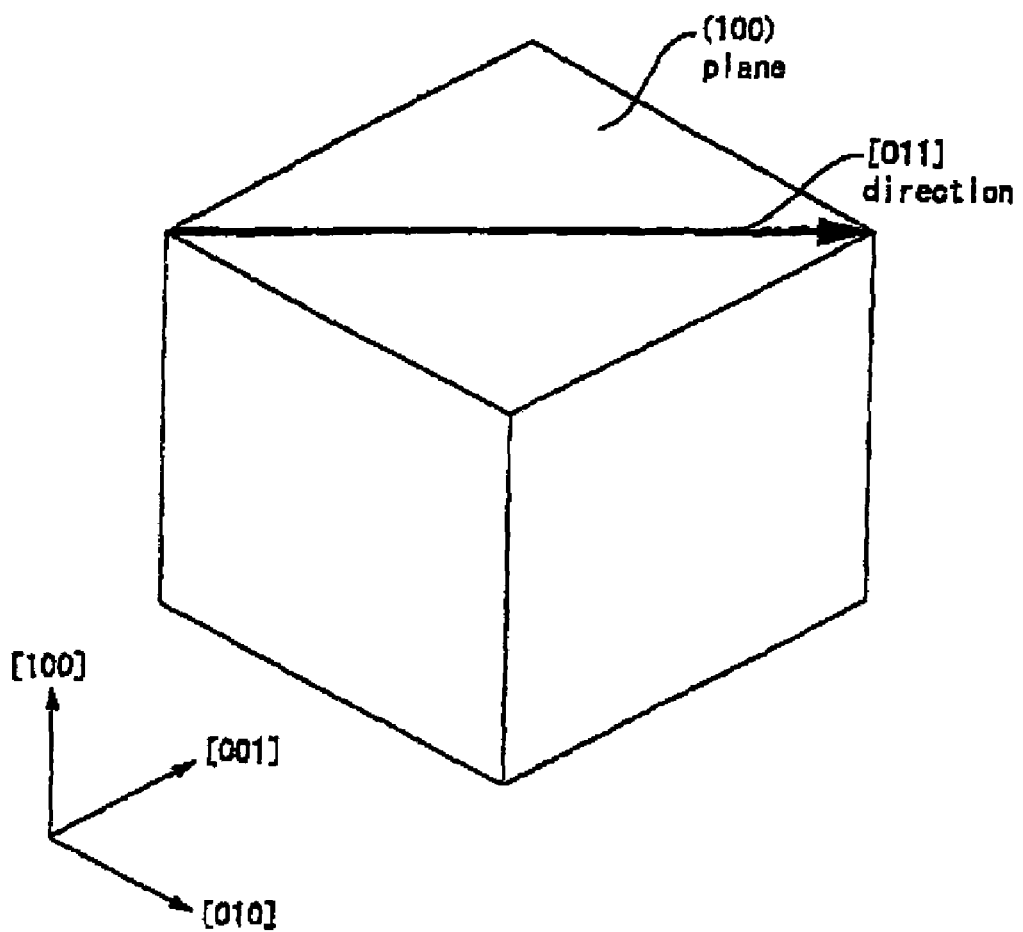
FIG. 12A shows the [011] direction and the (100) plane relative to a substrate unit cell.
Figure 12C:
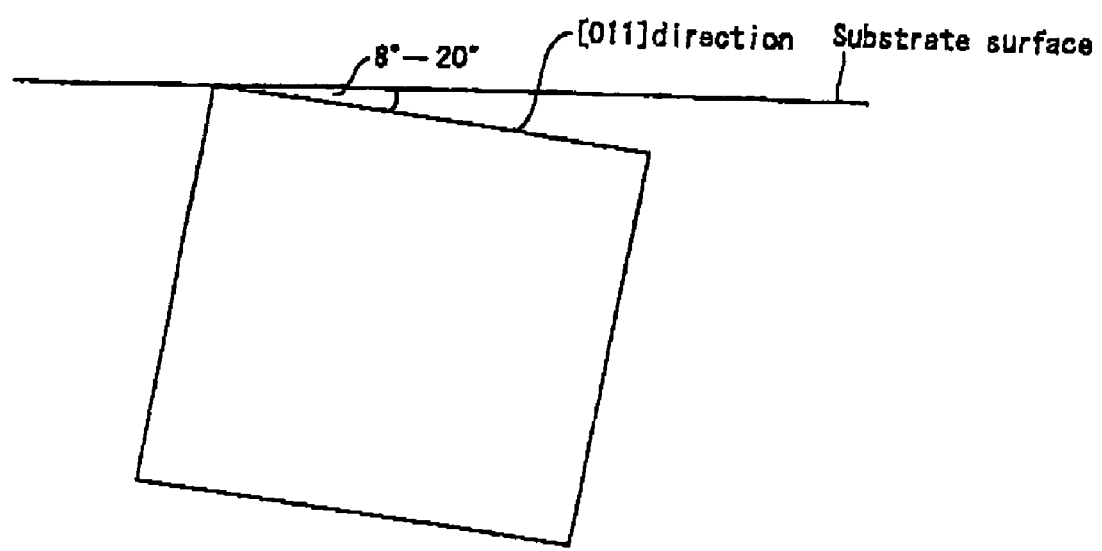
FIG. 12C is a side view of a substrate having an 8° to 20° incline in the [011] direction.

In a preferred embodiment of the present invention, crystal of the substrate is inclined by about 8° (8 degrees) to about 20° (20 degrees) in a [011] direction with respect to a (100) plane (see FIGS. 12A–12C). Therefore, when an $(Al_xGa_{1-x})_yIn_{1-y}P$ current diffusion layer with a thickness of about 5 to 10 μm which lattice-mismatches with a light-emitting structure is to be grown on a light-emitting structure, a hillock is not generated (which is otherwise generated due to lattice mismatching), so that a flat current diffusion layer can be obtained.

In a preferred embodiment of the present invention, the mole fraction of the $(Al_xGa_{1-x})_yIn_{1-y}P$ current diffusion layer is selected in such a manner that the current diffusion layer becomes transparent with respect to a light-emission wavelength of the light-emitting structure. It is important that the current diffusion layer is transparent to a light-emission wavelength of the light-emitting structure and has a sufficiently low resistivity. Even in the case where there is lattice mismatching, as long as the above-mentioned two characteristics are satisfied, no disadvantages will arise.

Referring back to FIG. 1, a bandgap of AlGaInP type materials is increased by decreasing the In mole fraction thereof. Thus, a current diffusion layer which is transparent to light having a wavelength of about 550 nm to about 650 nm can be formed even without increasing the Al mole fraction thereof.

In a preferred embodiment of the present invention, the Al mole fraction x of the $(Al_xGa_{1-x})_yIn_{1-y}P$ current diffusion layer is preferably set to be about 0.01 to about 0.05, while the In mole fraction 1-y thereof is preferably set to be about 0.01 to about 0.30. The AlGaInP current diffusion layer with such a small Al fraction is unlikely to be deliquescent. Thus, the light-emission characteristics do not deteriorate even when operated under the conditions of high temperature and high humidity, unlike the case where the conventional $Al_{0.65}Ga_{0.35}As$ current diffusion layer is employed.

Thus, according to the present invention, a current diffusion layer capable of being practically used can be produced.

The present invention will be now described by way of illustrative embodiments with reference to the accompanying drawings. However, the present invention is not limited thereto.

Embodiment 1

Figure 4:
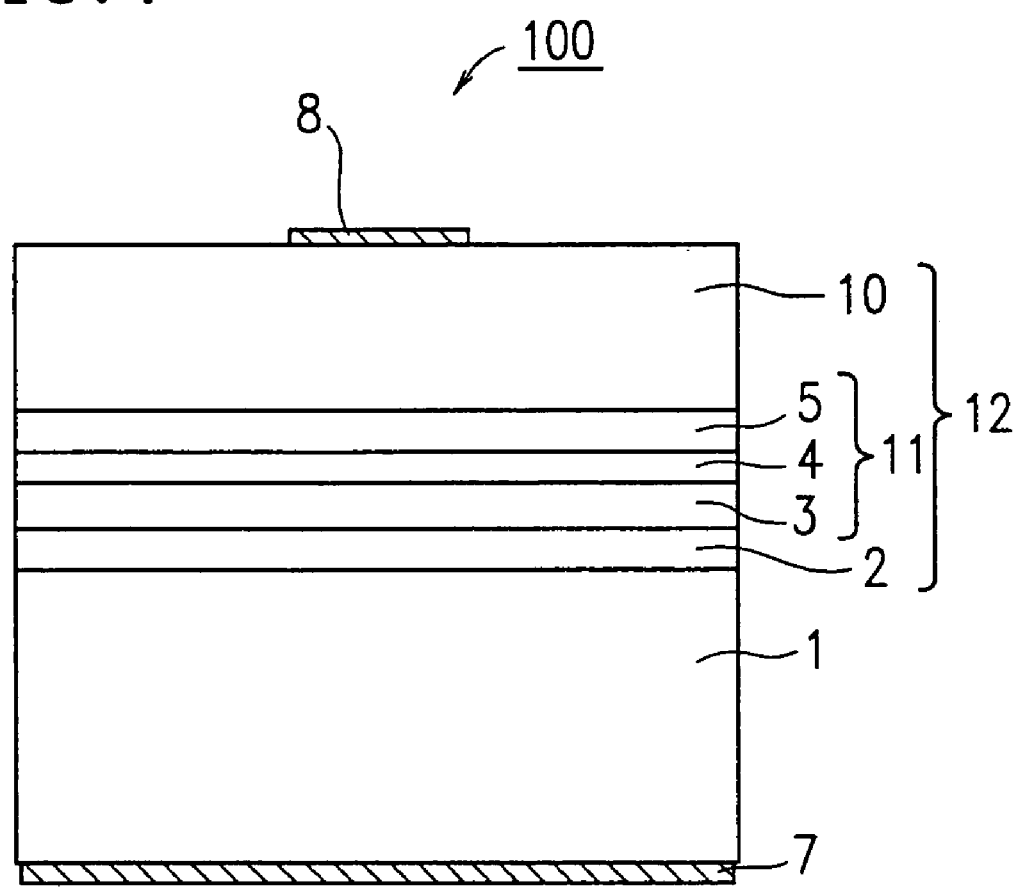
FIG. 4 is a schematic cross-sectional view of a light-emitting diode in Embodiment 1 of the present invention.

A semiconductor light-emitting diode exemplified in Embodiment 1 of the present invention will be described below with reference to FIG. 4. FIG. 4 is a cross-sectional view showing a structure of a light-emitting diode 100 in Embodiment 1.

As shown in FIG. 4, the light-emitting diode 100 includes an n-type GaAs substrate 1, a layered structure 12, an n-type electrode 7, and a p-type electrode 8. The layered structure 12 includes an n-type GaAs buffer layer 2, an $(Al_xGa_{1-x})_{0.51}In_{0.49}P$ light-emitting structure 11, and a p-type $(Al_xGa_{1-x})_yIn_{1-y}P$ current diffusion layer 10. The $(Al_xGa_{1-x})_{0.51}In_{0.49}P$ light-emitting structure 11 includes an n-type $(Al_xGa_{1-x})_{0.51}In_{0.49}P$ lower cladding layer 3, an $(Al_xGa_{1-x})_{0.51}In_{0.49}P$ active layer 4, and a p-type $(Al_xGa_{1-x})_{0.51}In_{0.49}P$ upper cladding layer 5. The p-type electrode 8 is provided on the top surface of the current diffusion layer 10, and the n-type electrode 7 is provided on the bottom surface of the substrate 1.

In the $(Al_xGa_{1-x})_{0.51}In_{0.49}P$ light-emitting structure 11, the mole fractions x in the lower cladding layer 3, the active layer 4, and the upper cladding layer 5 are about 1.0, about 0.3, and about 1.0, respectively. However, the mole fractions x are not limited to these values, and can independently have any value in a range of $0 \leq x \leq 1$.

In the p-type $(Al_xGa_{1-x})_yIn_{1-y}P$ current diffusion layer 10, an Al mole fraction x is about 0.05, and an In mole fraction 1-y is about 0.05.

A method for producing the light-emitting diode 100 in Embodiment 1 will be described below. The mole fraction of each layer is as described above.

The buffer layer 2, the lower cladding layer 3 (thickness: about 1.0 μm), the active layer 4 (thickness: about 0.5 μm), and the upper cladding layer 5 (thickness: about 1.0 μm) are successively formed on the substrate 1 by any known method in the art. The current diffusion layer 10 (thickness: about 7.0 μm) is then formed on the upper cladding layer 5 by any known method in the art. Then, an Au—Be film is formed by vapor deposition on the current diffusion layer 10, and patterned to, for example, a circular shape to form the p-type electrode 8. On the bottom surface of the GaAs substrate 1, then-type electrode 7 (e.g., made of an Au—Zn film) is formed by vapor deposition. Thus, the light-emitting diode 100 is produced.

Any appropriate method known in the art can be used for forming each layer. The electrodes 7 and 8 can have any other appropriate shape and can be formed by any other appropriate method.

In the light-emitting diode 100 thus produced, the GaAs substrate 1, the buffer layer 2, the lower cladding layer 3, the active layer 4, and the upper cladding layer 5 are lattice-matched with each other. However, the current diffusion layer 10 lattice-mismatches with these layers. This is because the Al and In contents of the current diffusion layer 10 as described above are smaller than the values required for realizing the lattice-matching. The lattice mismatch of the current diffusion layer 10 with respect to the underlying light-emitting structure 11 and the substrate 1 is about −4% in the above-mentioned structure. Alternatively, the current diffusion layer 10 preferably has a lattice mismatch with respect to the underlying light-emitting structure 11 and the substrate 1 of about −1% or less, more preferably in the range of about −4% to about −3%.

Furthermore, the AlGaInP current diffusion layer 10 has a resistivity of about 0.1 Ω cm, which is similar to that of a conventional current diffusion layer made of AlGaAs.

Figure 8:
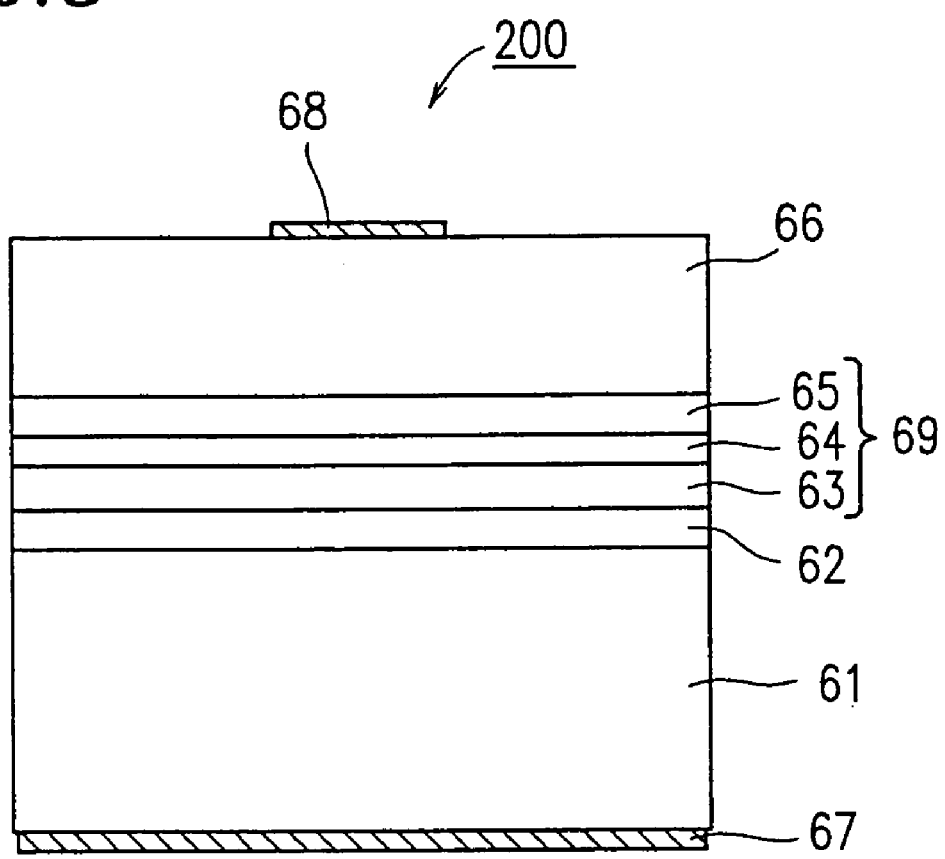
FIG. 8 shows a schematic cross-sectional view of a conventional light-emitting diode.
Figure 9:
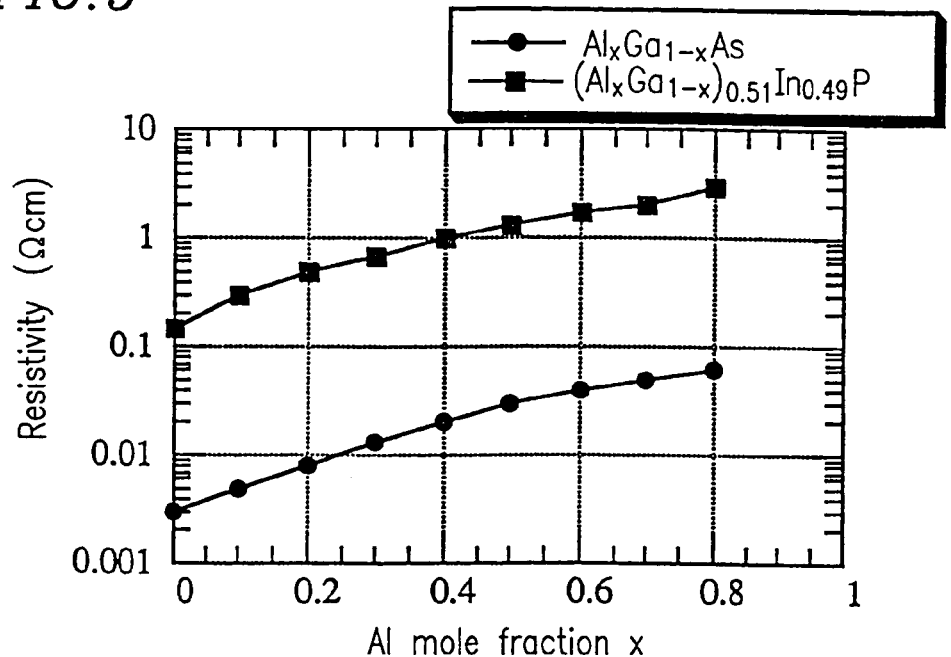
FIG. 9 shows a graph illustrating the relationship between the resistivity of AlGaAs type and AlGaInP type current diffusion layers, which are both lattice-matched with a GaAs substrate, and the Al mole fraction thereof.
Figure 10:
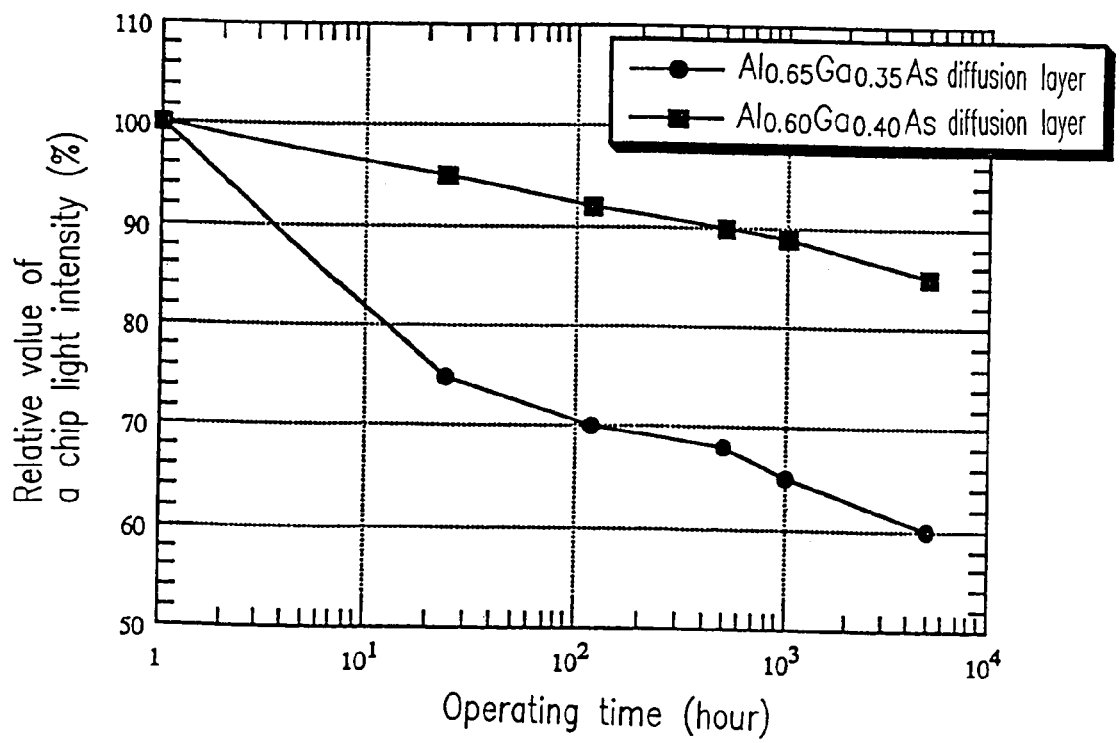
FIG. 10 shows graphs illustrating changes in a chip light intensity of conventional light-emitting diodes with a passage of time.

As described above, the light-emitting diode 100 of the present invention is different from the conventional light-emitting diode 200 described with reference to FIG. 8 in terms of the material to be used for forming the current diffusion layer 10.

Specifically, in the conventional light-emitting diode 200, the current diffusion layer 66 is made of an AlGaAs material. Therefore, when the light-emitting diode 200 is operated under the conditions of high temperature and high humidity, the surface of the current diffusion layer 66 becomes deliquescent to form the black-colored portions 66a (see FIG. 8). As a result, a chip light intensity is deteriorated, whereby the reliability of the conventional light-emitting diode 200 is likely to decrease.

In contrast, in the light-emitting diode 100 of the present invention, the current diffusion layer 10 is made of a p-type $(Al_xGa_{1-x})_yIn_{1-y}P$ material (e.g., x=0.05, 1−y=0.05). Thus, the Al mole fraction x of the current diffusion layer 10 is small. Accordingly, when the light-emitting diode 100 is operated under the conditions of high temperature and high humidity, the current diffusion layer 10 does not have deliquescence and does not become black. As a result, the light-emitting diode 100 of the present invention can be stably operated even with high reliability.

Figure 5:
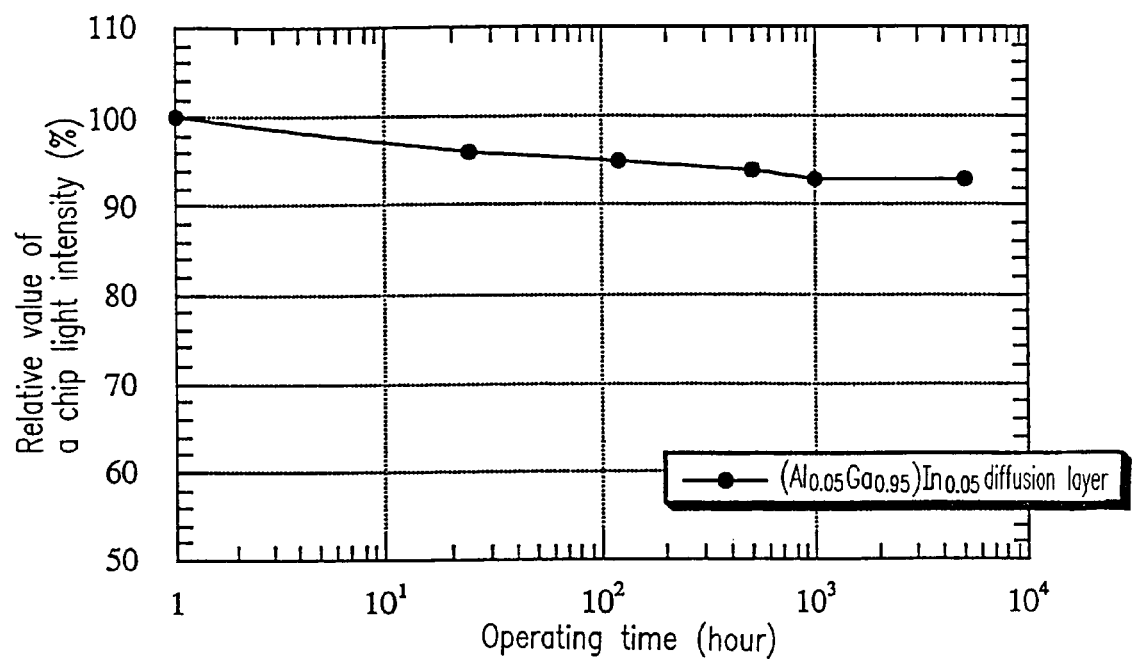
FIG. 5 shows a graph illustrating changes in a chip light intensity of a light-emitting diode according to the present invention with a passage of time.

FIG. 5 shows, as reliability data of the light-emitting diode 100 of the present invention which has the above-mentioned structure, the chip light intensity with a passage of time. In FIG. 5, data for the chip light intensities are indicated as relative values.

It is understood from FIG. 5 that a chip light intensity shows only a slight change (deterioration) during a relatively long period of time up to about 1000 hours under the conditions of a temperature of about 60° C., a humidity of about 95%, and an operating current of about 50 mA.

As described above, in Embodiment 1, the current diffusion layer 10 is made of an AlGaInP type material. Therefore, a light-emitting diode 100 is provided, which has high reliability over a long period of time even when operated under the conditions of high temperature and high humidity.

In Embodiment 1, by using the current diffusion layer 10 made of AlGaInP containing a small amount of Al and In as described above, the resistivity of the AlGaInP current diffusion layer 10 can be prescribed to be as low as that of the conventional current diffusion layer made of AlGaAs. Thus, a light-emitting diode 100 is provided, which has an AlGaInP current diffusion layer 10 provided with a long current diffusion distance from the upper electrode 8 and therefore with a high current diffusion ability. As a result, even when the current diffusion layer 10 is made of an AlGaInP type material, a light-emitting diode 100 having the similar luminance characteristics to those of a conventional light-emitting diode using an AlGaAs type material can be provided.

Furthermore, as the substrate 1 of the light-emitting diode 100 of the present invention, a substrate which is inclined, preferably, by about 8° (8 degrees) to about 20° (20 degrees) in a [011] direction with respect to a (100) plane may be used. Thus, even when the $(Al_xGa_{1-x})_yIn_{1-y}P$ current diffusion layer 10 is a lattice-mismatching layer as described above, growth of the $(Al_xGa_{1-x})_yIn_{1-y}P$ current diffusion layer 10 is prevented from starting from a step which functions as a growth nucleus in a certain orientation. Accordingly, even when a lattice-mismatching $(Al_xGa_{1-x})_yIn_{1-y}P$ current diffusion layer 10 has a thickness of about 5 μm to about 10 μm, the flat layer can be grown. Therefore, a p-type electrode 8 of a high quality can be formed on the $(Al_xGa_{1-x})_yIn_{1-y}P$ current diffusion layer 10 with good controllability.

Furthermore, the $(Al_xGa_{1-x})_yIn_{1-y}P$ current diffusion layer 10 which is transparent to light having a wavelength of about 550 nm to 650 nm emitted from the light-emitting structure 11 can be obtained due to its small amount of In therein.

Embodiment 2

Figure 6:
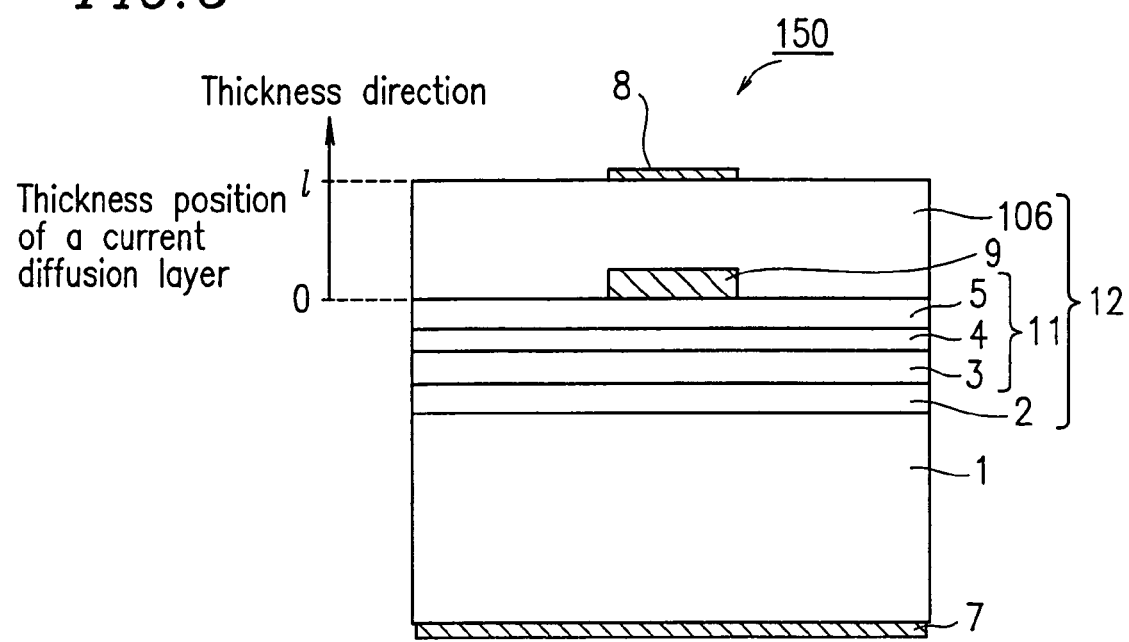
FIG. 6 shows a schematic cross-sectional view of a light-emitting diode in Embodiment 2 of the present invention.

A semiconductor light-emitting diode exemplified in Embodiment 2 of the present invention will be described below with reference to FIG. 6. FIG. 6 is a cross-sectional view showing a structure of a light-emitting diode 150 in Embodiment 2.

As shown in FIG. 6, the light-emitting diode 150 in Embodiment 2 includes an n-type GaAs substrate 1, a layered structure 12, an n-type electrode 7, and a p-type electrode 8. The layered structure 12 includes an n-type GaAs buffer layer 2, an $(Al_xGa_{1-x})_{0.51}In_{0.49}P$ light-emitting structure 11, an n-type $(Al_xGa_{1-x})_yIn_{1-y}P$ current blocking layer 9, and a p-type $(Al_xGa_{1-x})_yIn_{1-y}P$ current diffusion layer 106. The light-emitting structure 11 includes an n-type $(Al_xGa_{1-x})_{0.51}In_{0.49}P$ lower cladding layer 3, an $(Al_xGa_{1-x})_{0.51}In_{0.49}P$ active layer 4, and a p-type $(Al_xGa_{1-x})_{0.51}In_{0.49}P$ upper cladding layer 5. The p-type electrode 8 is provided on the top surface of the current diffusion layer 106, and the n-type electrode 7 is provided on the bottom surface of the substrate 1.

In the $(Al_xGa_{1-x})_{0.51}In_{0.49}P$ light-emitting structure 11, the mole fractions x in the lower cladding layer 3, the active layer 4, and the upper cladding layer 5 are about 1.0, about 0.3, and about 1.0, respectively. However, the mole fractions x are not limited to these values, and can independently have any value in a range of $0 \leq x \leq 1$.

In the n-type $(Al_xGa_{1-x})_yIn_{1-y}P$ current blocking layer 9, an Al mole fraction x is about 0.30, and an In mole fraction 1−y is about 0.49.

Furthermore, in the p-type $(Al_xGaI)_yIn_{1-y}P$ current diffusion layer 106 of Embodiment 2, the mole fractions are varied along the thickness direction. Accordingly, the p-type $(Al_xGa_{1-x})_yIn_{1-y}P$ current diffusion layer 106 in the light-emitting diode 150 of the present embodiment is a graded layer.

Figure 7A:
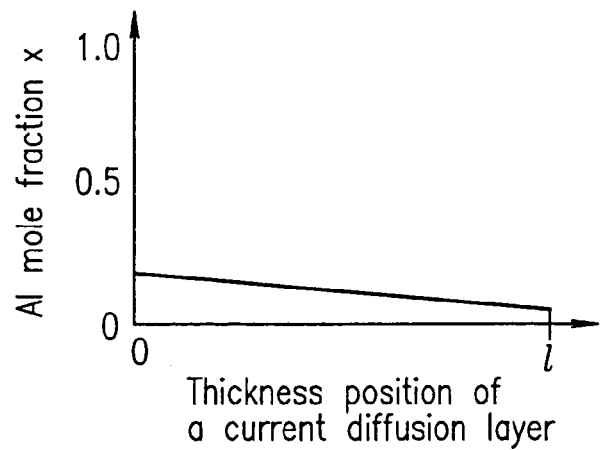
FIG. 7A(a) shows a graph illustrating values of the Al mole fraction x at various thickness positions of the graded $(Al_xGa_{1-x})_yIn_{1-y}P$ current diffusion layer in Embodiment 2.
Figure 7A:
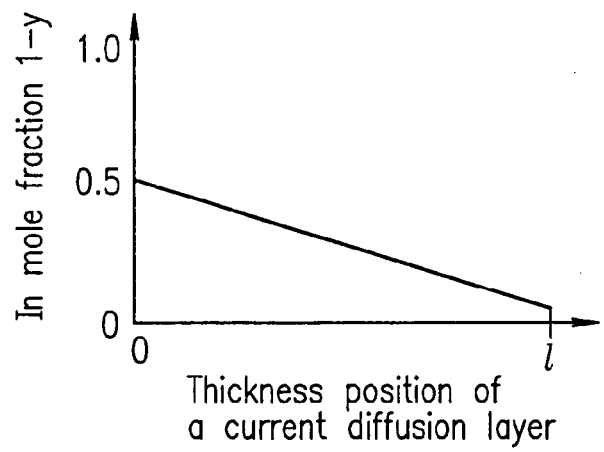
Figure 7B:
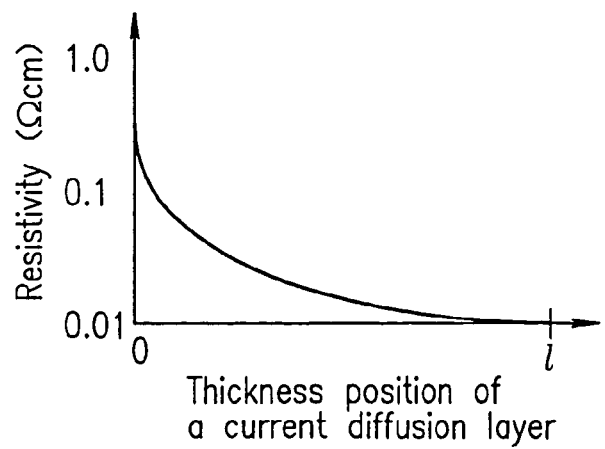
FIG. 7B shows a graph illustrating values of the resistivity at the various thickness positions of the graded $(Al_xGa_{1-x})_yIn_{1-y}P$ current diffusion layer in Embodiment 2.

FIGS. 7A(a) and 7A(b) show values of the Al mole fraction x and the In mole fraction 1−y at various positions along the thickness direction (i.e., at the various thickness positions) of the graded $(Al_xGa_{1-x})_yIn_{1-y}P$ current diffusion layer 106, respectively. FIG. 7B shows values of the resistivity at the various thickness positions of the graded $(Al_xGa_{1-x})_yIn_{1-y}P$ current diffusion layer 106. Herein, the thickness direction of the current diffusion layer 106 is shown in FIG. 6. Thus, in the graded $(Al_xGa_{1-x})_yIn_{1-y}P$ current diffusion layer 106 in Embodiment 2, the In and Al mole fractions are gradually varied from the lower portion (i.e., from the interface with the light-emitting structure 11) toward the upper portion (i.e., toward the top surface thereof).

A method for producing the light-emitting diode 150 in Embodiment 2 will be described below. The mole fraction of each layer is as described above.

The buffer layer 2, the lower cladding layer 3 (thickness: about 1.0 μm), the active layer 4 (thickness: about 0.5 μm), and the upper cladding layer 5 (thickness: about 1.0 μm) are successively formed on the substrate 1, and the current blocking layer 9 (thickness: about 1.0 μm) is further formed on the upper cladding layer 5, in a growth furnace by any known method in the art. After the substrate 1 having the grown layers thereon is taken out of the growth furnace, a part of the current blocking layer 9 is removed by etching so as to be patterned into a prescribed shape. Then, the substrate 1 with the resultant layered structure is again set in the growth furnace, and the graded $(Al_xGa_{1-x})_yIn_{1-y}P$ current diffusion layer 106 (thickness: about 6 μm) is regrown while gradually varying the Al and In mole fractions thereof along its thickness direction (i.e., x=0.20 to 0.01, and 1−y=0.49 to 0.01, as illustrated in FIGS. 7A(a) and 7A(b), respectively). Thereafter, the n-type electrode 7 is formed on the bottom surface of the substrate 1, and the p-type electrode 8 is formed on the graded current diffusion layer 106. The p-type electrode 8 is then selectively etched away in such a manner that only the portion thereof right above the current blocking layer 9 remains. Thus, the light-emitting diode 150 is produced.

As described above, the light-emitting diode 150 in Embodiment 2 has the current blocking layer 9. This is advantageous for the following reason.

Light emitted from a portion of the light-emitting structure 11 right below the p-type electrode 8 cannot be taken out since it is blocked by the electrode 8. Thus, by providing the current blocking layer 9 in the lower portion of the graded current diffusion layer 106 so as to be positioned right below the p-type electrode 8, a current to be injected into the light-emitting structure 11 is allowed to be effectively spread so as to not flow in the portion right below the p-type electrode 8. Thus, the light-emission from the portion right below the p-type electrode 8 is prevented. Accordingly, an invalid current which otherwise flows into the portion right below the p-type electrode 8 is reduced, and a light-emission efficiency can be improved.

The graded $(Al_xGa_{1-x})_yIn_{1-y}P$ current diffusion layer 106 in Embodiment 2 will be further described with reference to FIGS. 6, 7A(a), 7A(b), and 7B.

In an initial growth stage of the graded $(Al_xGa_{1-x})_yIn_{1-y}P$ current diffusion layer 106, i.e., at a portion of the graded $(Al_xGa_{1-x})_yIn_{1-y}P$ current diffusion layer 106 in the vicinity of the light-emitting structure 11 and the current blocking layer 9 (in FIG. 6, in the vicinity of a position of about 0 in a thickness direction, i.e., in the vicinity of a thickness position of about 0), the Al mole fraction x and the In mole fraction 1−y are set to be about 0.20 and about 0.49, respectively as illustrated in FIGS. 7A(a) and 7A(b). On the other hand, referring again to FIG. 1, a lattice constant of $(Al_xGa_{1-x})_yIn_{1-y}P$ is mainly influenced by an In mole fraction 1−y, not by an Al mole fraction x (or a Ga mole fraction complementary to Al mole fraction x). As described above, the In mole fraction 1−y of the graded $(Al_xGa_{1-x})_yIn_{1-y}P$ current diffusion layer 106 in the vicinity of the thickness position of 0 is substantially equal to the In mole fraction (about 0.49) of the light-emitting structure 11 and the current blocking layer 9. Accordingly, the lattice constant of the graded $(Al_xGa_{1-x})_yIn_{1-y}P$ current diffusion layer 106 in an initial growth stage thereof is substantially equal to that of the light-emitting structure 11, and thus, the graded $(Al_xGa_{1-x})_yIn_{1-y}P$ current diffusion layer 106 can be grown to be flat. Furthermore, the Al mole fraction x of the graded $(Al_xGa_{1-x})_yIn_{1-y}P$ current diffusion layer 106 in the initial growth stage is set at a relatively high value, the graded $(Al_xGa_{1-x})_yIn_{1-y}P$ current diffusion layer 106 in the vicinity of the thickness position of 0 (i.e., in the vicinity of the interface with the underlying light-emitting structure 11) is likely to match the composition of the underlying upper cladding layer 5; thus, satisfactory crystallinity can be obtained.

The Al and In mole fractions of the graded $(Al_xGa_{1-x})_yIn_{1-y}P$ current diffusion layer 106 are gradually decreased along the thickness direction toward the upper position thereof, whereby both of the Al and In mole fractions in the uppermost portion (at a thickness position 1 in FIG. 6) of the graded $(Al_xGa_{1-x})_yIn_{1-y}P$ current diffusion layer 106 are prescribed to be 0.01.

FIG. 7B shows the corresponding changes in resistivity of the graded $(Al_xGa_{1-x})_yIn_{1-y}P$ current diffusion layer 106.

It is understood from FIG. 7B that since the Al and In mole fractions are high in an initial growth stage, the graded $(Al_xGa_{1-x})_yIn_{1-y}P$ current diffusion layer 106 shows a resistivity substantially the same as that of the light-emitting structure 11. However, the Al and In mole fractions are decreased with the increase in the thickness, so that a resistivity is also decreased. It should be noted that in the light-emitting diode 150 provided with the current blocking layer 9, a current is more likely to be spread throughout the whole chip through a portion of the current diffusion layer 106 which has a lower resistivity positioned closer to the p-type electrode 8, whereby an operating voltage is less likely to be increased. On the other hand, even when a resistivity of the current diffusion layer 106 in a portion closer to the light-emitting structure 11 is relatively high there is no significant influence on, current diffusion capability and operating voltage.

As set forth above, in Embodiment 2, the portion of the graded $(Al_xGa_{1-x})_yIn_{1-y}P$ current diffusion layer 106 in the vicinity of the underlying light-emitting structure 11 has substantially the same In mole fraction as those of the light-emitting structure 11 and the current blocking layer 9. Accordingly, the lattice constant of the portion of the graded current diffusion layer 106 in the vicinity of the light-emitting structure 11 becomes substantially equal to those of the light-emitting structure 11 and the current blocking layer 9. This enhances crystallinity and flatness of a portion of the graded current diffusion layer 106 to be grown in an initial growth stage.

Furthermore, the interface of the graded current diffusion layer 106 with the light-emitting structure 11 and the current blocking layer 9 is in a satisfactory condition. Moreover, the lattice constant of the graded current diffusion layer 106 is not rapidly changed since the mole fraction thereof changes gradually. Therefore, the improved crystallinity and flatness can be obtained throughout the entire current diffusion layer 106.

Furthermore, the Al and In mole fractions of the graded $(Al_xGa_{1-x})_yIn_{1-y}P$ current diffusion layer 106 are decreased as described above along the thickness direction toward the upper portion thereof. Therefore, the resistivity of the graded $(Al_xGa_{1-x})_yIn_{1-y}P$ current diffusion layer 106 is allowed to gradually decrease in the thickness direction while being kept uniform in a plane parallel to the top surface of the current diffusion layer 106. Thus, the injected current can be uniformly spread between the electrodes 7 and 8.

Accordingly, in Embodiment 2, the improved crystallinity and flatness of the $(Al_xGa_{1-x})_yIn_{1-y}P$ current diffusion layer 106 can be obtained without decreasing a light output efficiency or increasing an operating voltage.

Furthermore, in the case where the Al and In mole fractions are small (i.e., about 1% to about 5%) in an initial growth stage of the $(Al_xGa_{1-x})_yIn_{1-y}P$ current diffusion layer, a notch (a discontinuous portion) in the energy band structure is likely to be generated at the interface between the current diffusion layer and the upper cladding layer due to a difference in the bandgap energy or the interface level. Such a notch causes an operating voltage and a drive voltage to increase. On the other hand, in Embodiment 2, both of the graded current diffusion layer 106 and the upper cladding layer 5 in the vicinity of the interface therebetween have substantially the same In mole fractions as each other. Therefore, no notch in the energy band structure is generated. Thus, an operating voltage and power consumption are not increased.

Due to the above-mentioned advantage, the light-emitting diode 150 in Embodiment 2 can realize light-emission luminance which is about 1.2 times that of the conventional light-emitting diode.

In Embodiment 2, the light-emitting diode 150 has been described, in which the Al mole fraction x and the In mole fraction 1−y in an initial growth stage of the graded $(Al_xGa_{1-x})_yIn_{1-y}P$ current diffusion layer 106 are about 0.20 and about 0.49, respectively. However, the present invention is not limited thereto. Even with the different values of the Al mole fraction x and the In mole fraction 1−y, the same effect as set forth above can be obtained as long as the mole fractions of the graded current diffusion layer 106 are varied in the thickness direction.

Moreover, in Embodiment 2, the Al and In mole fractions of the graded $(Al_xGa_{1-x})_yIn_{1-y}P$ current diffusion layer 106 are gradually varied along the thickness direction. However, even when the mole fractions may be varied in a step-like manner into two, three, or more steps, the same effect as set forth above can be obtained.

As described above, the light-emitting diode of the present invention is provided with the current diffusion layer made of an $(Al_xGa_{1-x})_yIn_{1-y}P$ material, which is intentionally lattice-mismatched with the underlying light-emitting structure by appropriately selecting the Al mole fraction x and the In mole fraction 1−y in the composition thereof. Thus, a light-emitting diode whose light intensity is not deteriorated even under the conditions of high temperature and high humidity can be provided without decreasing a resistivity of the current diffusion layer. Furthermore, a light output efficiency from the light-emitting structure is enhanced, whereby a highly reliable light-emitting diode can be provided.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light-emitting diode, comprising:
a semiconductor substrate; and
a layered structure comprising an AlGaInP type compound semiconductor material provided on the semiconductor substrate, the layered structure comprising:
a light-emitting structure comprising of a pair of cladding layers and an active layer for emitting light provided between the pair of cladding layers; and a current diffusion layer comprising an AlGaInP type compound semiconductor material, the current diffusion layer being lattice-mismatched with the light-emitting structure, and
wherein crystal of the semiconductor substrate is inclined by 8° (degrees) to 20° (20 degrees) in a [011] direction with respect to a (100) plane thereof.

2. The light-emitting diode as in claim 1, wherein a lattice mismatch $\Delta a/a$ of the current diffusion layer with respect to the light-emitting structure is defined by $$\Delta a/a = (a_d - a_e)$$

where $a_d$ is a lattice constant of the current diffusion layer, and $a_e$ is a lattice constant of the light-emitting structure.

3. The light-emitting device as in claim 2, wherein the lattice mismatch is −1% or smaller.

4. A light-emitting diode, comprising:
a semiconductor substrate; and
a layered structure comprising an AlGaInP type compound semiconductor material provided on the semiconductor substrate, the layered structure comprising:
a light-emitting structure comprising a pair of cladding layers and an active layer for emitting light provided between the pair of cladding layers;
a current diffusion layer comprising an AlGaInP type material which is lattice-mismatched with the light-emitting structure and the semiconductor substrate; and wherein
the semiconductor substrate is inclined in a [011] direction with respect to a (100) plane thereof, and
wherein crystal of the semiconductor substrate is inclined by 8° (degrees) to 20° (20 degrees) in a [011] direction with respect to a (100) plane thereof.

* * * * *